(12) United States Patent
Bui (10) Patent No.: US 6,975,135 B1
(45) Date of Patent: Dec. 13, 2005

(54) UNIVERSALLY PROGRAMMABLE OUTPUT BUFFER

(75) Inventor: John H. Bui, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 33 days.

(21) Appl. No.: 10/316,716

(22) Filed: Dec. 10, 2002

(51) Int. Cl.[7] .......................................... H03K 19/003
(52) U.S. Cl. ......................................... 326/29; 326/31
(58) Field of Search ........................ 326/17, 29, 31–34, 326/50; 327/170

(56) References Cited

U.S. PATENT DOCUMENTS

| | | | |
|---|---|---|---|
| 5,568,081 A | * | 10/1996 | Lui et al. .................... 327/380 |
| 5,850,159 A | * | 12/1998 | Chow et al. ................. 327/394 |
| 5,917,758 A | * | 6/1999 | Keeth .................... 365/189.05 |
| 6,238,237 B1 | | 5/2001 | Wong et al. |
| 6,246,270 B1 | | 6/2001 | Wang et al. |
| 6,590,432 B1 | * | 7/2003 | Wu et al. .................... 327/108 |

* cited by examiner

*Primary Examiner*—James H. Cho
(74) *Attorney, Agent, or Firm*—Townsend and Townsend and Crew, LLP (57) ABSTRACT

Output buffers are provided that are compatible with any differential output standard. The output buffers compensate for variations in process, the supply voltage, and temperature. The edge rate of an output buffer can be programmed to be compatible with different output standards. The edge rate of an output buffer can compensate for variations in process, voltage, and temperature. The output voltage of an output buffer can be adjusted to be compatible with different output standards.

28 Claims, 4 Drawing Sheets

FIG. 4A
LVDS

FIG. 4B
LDT

FIG. 4C
LVPCL

UNIVERSALLY PROGRAMMABLE OUTPUT BUFFER

BACKGROUND OF THE INVENTION

The present invention relates to output buffer circuits, and more particularly, to output buffer circuits that can be programmed to provide different output voltages and output edge rates.

Integrated circuits typically have input/output (I/O) pins (i.e., pads). The I/O pins can be used to receive signals from outside the integrated circuit. The I/O pins can also be used to send internal signals outside the integrated circuit.

Output buffers are often used to drive an input signal from inside an integrated circuit to an I/O pin. An output buffer can provide an output voltage level that is compatible with an output standard such as LVDS. However, previously known output buffers have not been able to provide output voltage levels that can be programmed to be compatible with any output standard.

Therefore, it would be desirable to provide an output buffer with a programmable output voltage. It would also be desirable to provide an output buffer with a programmable output edge rate to drive packages with different loads or different fan-outs.

BRIEF SUMMARY OF THE INVENTION

The present invention provides output buffers that have programmable output voltages and programmable output edge rates. The time it takes for the output voltage of an output buffer to transition from high-to-low or from low-to-high is called the edge rate.

According to the present invention, the edge rate of an output buffer can be programmed to be compatible with different output standards and to drive packages that have different load levels or different fan-outs. The edge rate of an output buffer can be adjusted to change the data transfer rate by varying the current according to the equation $dV/dt=I/C$.

In another embodiment of the present invention, an output buffer includes circuitry that compensates for variations in process, voltage, and temperature to reduce variations in the output edge rates.

In a further embodiment of the present invention, the output voltage of an output buffer can be adjusted to be compatible with different output standards. The output voltage and the edge of an output buffer can be programmed independently of each other.

DETAILED DESCRIPTION OF THE INVENTION

Figure 1:
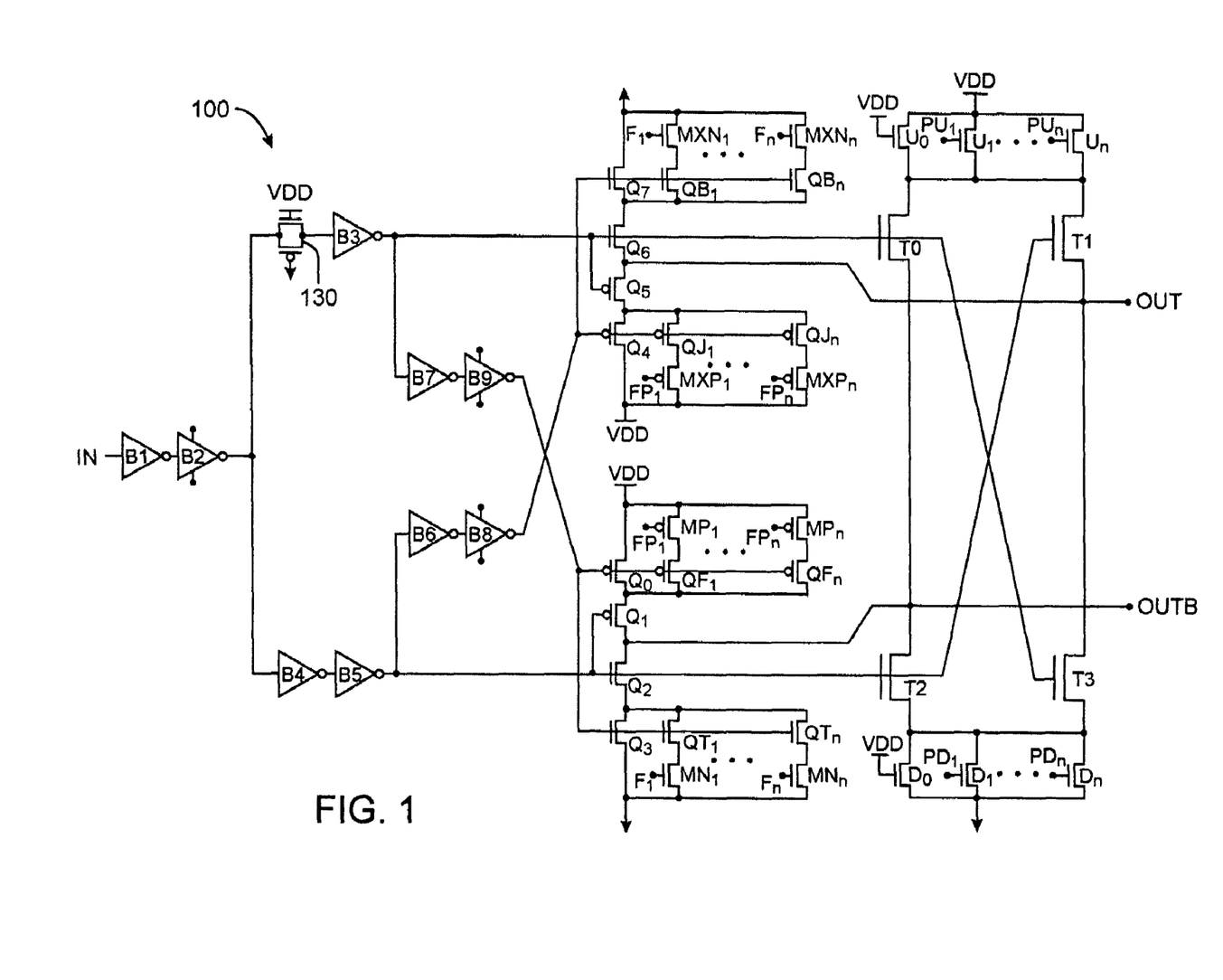
FIG. 1 illustrates a schematic of an output buffer according to a first embodiment of the present invention.

FIG. 1 illustrates a first embodiment of an output buffer according to the present invention. Output buffer 100 receives an input voltage at input terminal IN, and provides differential output voltages at output terminals OUT and OUTB. Output buffers of the present invention can be used in programmable integrated circuits such as programmable logic devices (PLD), field programmable gate arrays, (FPGA), and programmable logic arrays (PLA).

Transistors T0, T1, T2, and T3 in output buffer 100 form a differential driver. The differential driver drives the output voltage at output terminals OUT and OUTB in response to an input voltage at input terminal IN.

Figure 2:
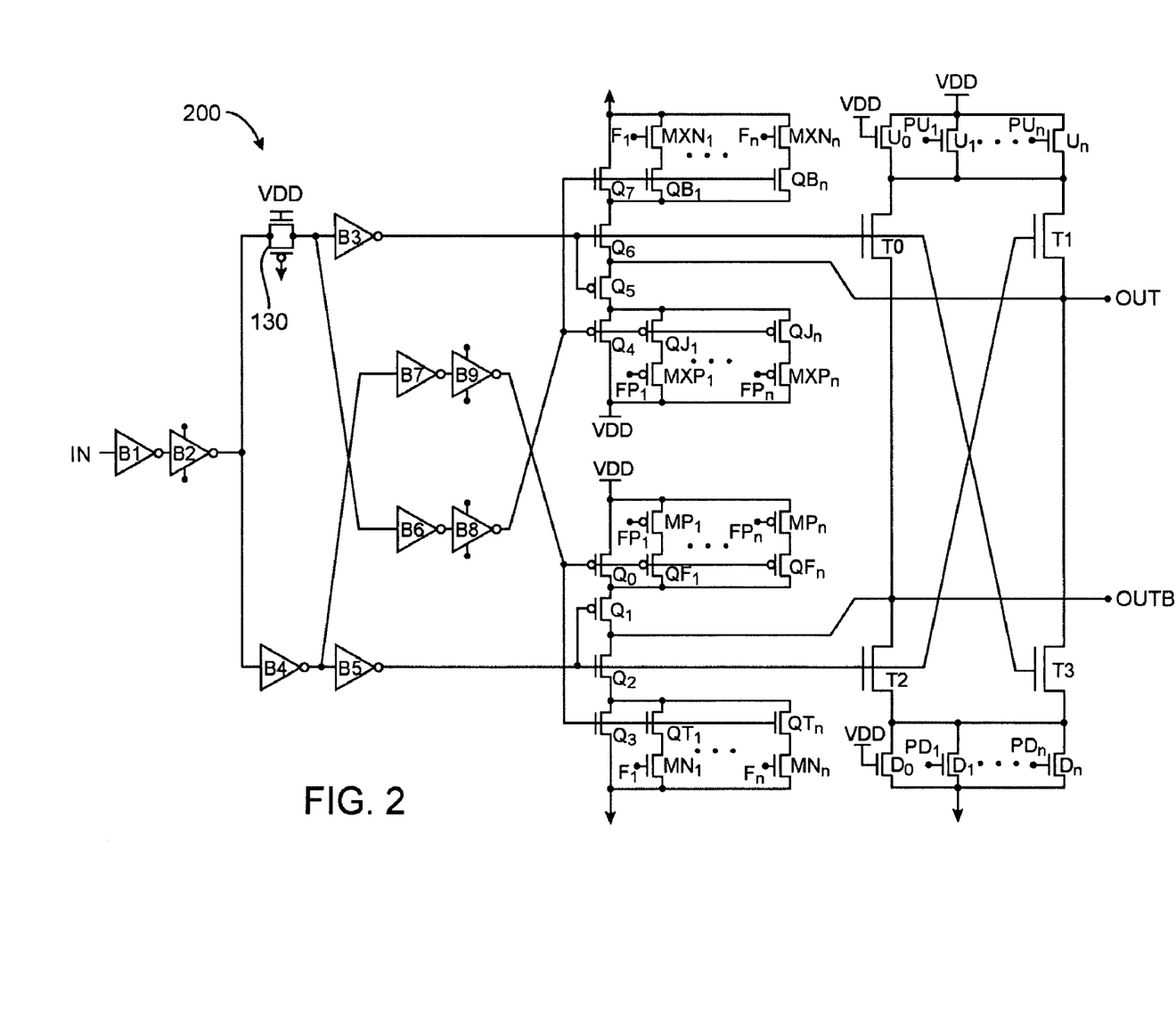
FIG. 2 illustrates a schematic of an output buffer according to a second embodiment of the present invention.
Figure 3:
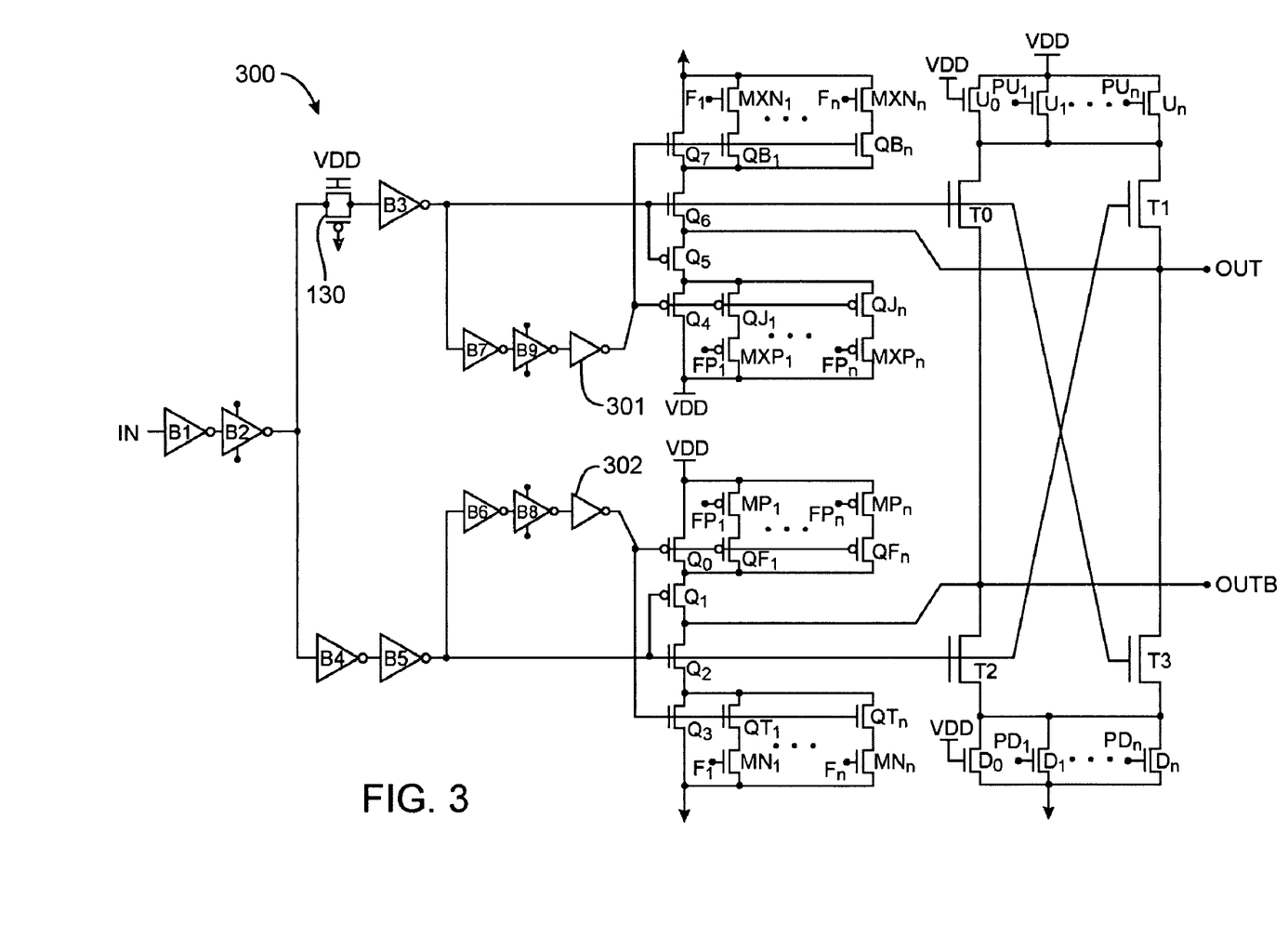
FIG. 3 illustrates a schematic of an output buffer according to a third embodiment of the present invention.

The differential driver can drive the output voltages at OUT and OUTB to $V_{OH}$ or $V_{OL}$. Additional output voltages are also possible. $V_{OH}$ is at or near a high supply voltage source $V_{DD}$. $V_{OL}$ is at or near a low common voltage source $V_{SS}$ such as ground. The arrows in FIGS. 1–3 represent a low common voltage source $V_{SS}$, such as ground.

The voltage at output terminal OUT is pulled up to $V_{OH}$ when n-channel pull-up transistor T1 is ON and n-channel transistor T3 is OFF. When transistor T1 is ON, transistor T3 is OFF, as will be discussed in further detail below.

When T1 is ON, current flows from $V_{DD}$ through transistors U0 and T1 to output terminal OUT. N-channel transistor U0 is always ON, because its gate is coupled to $V_{DD}$.

The voltage at OUT is pulled down to $V_{OL}$ when transistor T3 is ON and transistor T1 is OFF. When pull down transistor T3 is ON and transistor T1 is OFF, current flows from OUT to ground through transistors T3 and D0. N-channel transistor D0 is always ON, because its gate is coupled to $V_{DD}$.

The voltage at output terminal OUTB is the inverse of the voltage at terminal OUT. Thus, when the voltage at OUT is at a digital high ($V_{OH}$), the voltage at OUTB is at a digital low ($V_{OL}$).

The voltage at output terminal OUTB is pulled up to $V_{OH}$ when n-channel transistor T0 is ON and n-channel transistor T2 is OFF. When pull up transistor T0 is ON, transistor T2 is OFF, as will be discussed in further detail below. When T0 is ON, current flows from $V_{DD}$ through transistors U0 and T0 to output terminal OUTB.

The voltage at OUTB is pulled down to $V_{OL}$ when pull down transistor T2 is ON and transistor T0 is OFF. When pull down transistor T2 is ON and transistor T0 is OFF, current flows from OUTB to ground through transistors T2 and D0.

Voltages $V_{OH}$ or $V_{OL}$ at OUT and OUTB can be adjusted to be compatible with any desired differential output standard such as Low Voltage Differential Signaling (LVDS), Lightning Data Transport (LDT) (also called hyper transport), Low Voltage Positive (or Pseudo) Emitter Coupled Logic (LVPECL), and Pseudo Current Mode Logic (PCML) output standards. Each output standard may require different voltage levels for $V_{OH}$ and $V_{OL}$. Output buffers of the present invention can adjust the voltage levels of $V_{OH}$ or $V_{OL}$ to accommodate the requirements of any differential output standard, as will now be discussed.

N-channel transistors U1 through UN are controlled by signals PU1 through PUN, respectively. Transistors U1 through UN represent any number of transistors that are controlled by a corresponds number of signals PU1 through PUN. For example, there may be one transistor U1, two transistors U1/U2, three transistors U1/U2/U3, etc.

Signals PU1 through PUN are received at the gates of transistors U1 through UN. When one of signals PU1 through PUN goes high, a corresponding one of transistors U1 through UN turns ON. More current flows from $V_{DD}$ to the output (OUT or OUTB) as more of transistors U1 through UN turn ON. As more current flows to the output, the voltage $V_{OH}$ at the output increases.

Signals PU1 through PUN can be manipulated to turn ON one or more of transistors U1 through UN to increase $V_{OH}$ to a desired level. Similarly, one or more of transistors U1 through UN can be turned OFF to decrease $V_{OH}$ to a desired level. Thus, transistors U1 through UN allow the high voltage $V_{OH}$ at the output to be adjusted to a level that is compatible with any differential output standard.

N-channel transistors D1 through DN are controlled by signals PD1 through PDN, respectively. Transistors D1 through DN represent any number of transistors that are controlled by a corresponds number of signals PD1 through PDN.

When one of signals PD1 through PDN goes high, a corresponding one of transistors D1 through DN turns ON. More current flows from the output (OUT or OUTB) to ground as more of transistors D1 through DN turn ON. As more current flows from the output to ground, the voltage VOL at the output decreases.

Signals PD1 through PDN can be manipulated to turn ON one or more of transistors D1 through DN to decrease $V_{OL}$ to a desired level. Similarly, one or more of transistors D1 through DN can be turned OFF to increase $V_{OL}$ to a desired level. Thus, transistors D1 through DN allow voltage $V_{OL}$ at the output to be adjusted to a level that is compatible with any differential output standard.

Because output voltages $V_{OH}$ or $V_{OL}$ can be adjusted, the differential output voltage $V_{OD}$ between $V_{OH}$ and $V_{OL}$ can also be adjusted using the previously discussed techniques to accommodate any differential output standard. In another embodiment of the present invention, a common mode voltage (between $V_{OH}$ and $V_{OL}$) can be adjusted by controlling transistors U1 through UN and D1 through DN.

Termination resistors are typically coupled between OUT and OUTB. Sometimes termination resistors can be coupled to $V_{DD}$ or $V_{SS}$ to achieve a voltage swing at the output between $V_{OH}$ and $V_{OL}$. The value of the termination resistors effects value of the differential output signal $V_{OD}$. For example, a 100 ohm or a 50 ohm resistor can be used.

According to the present invention, the output voltages $V_{OH}$ and $V_{OL}$ at OUT and OUTB can be adjusted independently of each other. For example $V_{OH}$ at OUT can be increased without effecting $V_{OL}$ at OUT.

The propagation of a signal from the input terminal IN to output terminals OUT and OUTB will now be discussed with respect to FIG. 1. Output buffer 100 includes eight inverting buffers, B1, B2, B3, B4, B5, B6, B7, B8, and B9. These buffers may each include, for example, a CMOS inverter. Output buffer 100 also includes n-channel transistors Q2, Q3, Q6, and Q7 and p-channel transistors Q0, Q1, Q4, and Q5. Buffer 100 also includes pass gate 130. Pass gate 130 is a non-inverting gate.

When the voltage at IN has stabilized at a low voltage (e.g., at or near ground), the voltages at the gates of transistors T0 and T3 are at high voltages (e.g., at or near $V_{DD}$), and the voltages at the gates of transistors T1 and T2 are at low voltages. Thus, transistors T0 and T3 are ON, and transistors T1 and T2 are OFF. The voltage at OUT is at $V_{OL}$ and the voltage at OUTB is at $V_{OH}$.

After the voltage at IN changes state (e.g., from low to high), the output voltages of buffers B1–B9 also change state. A signal does not pass through buffers B1–B9 instantaneously. The output voltage of one of buffers B1–B9 changes state a short time period after its input voltage changes state. There is also a delay associated with the propagation of the signal through pass gate 130. The delays associated with buffers B1–B9 and pass gate 130 slow down the propagation of a signal from the input terminal IN.

After the voltage at IN transitions from low to high, the output voltage of B3 transitions from high to low, causing transistor Q6 to turn OFF and transistor Q5 to turn ON. At this time, the recent voltage transition at IN has not propagated to the output of B8 yet, because the circuit path between IN and the output terminal of B8 includes six circuits (B1, B2, B4, B5, B6, and B8). The voltage transition at IN propagates through B3 faster than through B8, because the circuit path between IN and the output terminal of B3 only includes four circuits (B1–B3 and pass gate 130). Therefore, the output voltage of B8 remains low, transistors Q4 and QJ1 through QJn remains ON, and transistors Q7 and QB1 through QBn remain OFF for a period of time after the output of B3 goes low.

Because transistors Q4 and Q5 are ON, current flows from the supply voltage to OUT. The extra current through transistors Q4 and Q5 helps to pull the voltage at OUT up to $V_{OH}$ faster. Transistor Q6 is OFF, preventing current from flowing from OUT through Q6 to ground.

The extra current through p-channel transistors Q4 and Q5 provides a faster rising edge rate at OUT. The rising edge rate at OUT can be increased further by turning ON one or more of p-channel transistors MXP1 through MXPn. Transistors MXP1 through MXPn represent any number of p-channel transistors. Each of transistors MXP1 through MXPn is coupled to a corresponding one of transistors QJ1 through QJn, as shown in FIG. 1.

Transistors MXP1 through MXPn are controlled by signals FP1 through FPn, respectively. Any one of signals FP1 through FPn can be pulled to a low voltage to turn ON a corresponding one of transistors MXP1 through MXPn.

P-channel transistors QJ1 through QJn are ON, because the output of B8 is still low. When more of transistors MXP1 through MXPn are ON, more current flows from $V_{DD}$ to OUT, pulling OUT to $V_{OH}$ at a faster rate. Thus, the rising edge rate at OUT can be increased (or decreased) to be compatible with any differential output standard by turning ON or OFF transistors MXP1 through MXPn using programmable signals FP1 through FPn.

When the output voltage of B8 transitions high, transistor Q4 turns OFF, transistors QJ1 through QJn turn OFF, and transistor Q7 turns ON. The extra currents that help to pull OUT up to $V_{OH}$ through transistors Q4 and MXP1 through MXPn are now cut off.

Thus, the extra current provided by transistor Q4 (and transistors MXP1 through MXPn) to increase the rising edge rate at OUT only flows for a limited period of time. This limited period of time is defined by the time between when the output of B3 changes states and when the output of B8 changes state.

After the voltage at IN transitions from low to high, the output voltage of B5 also transitions from low to high, causing transistor Q1 to turn OFF and transistor Q2 to turn ON. At this time, the recent voltage transition at IN has not propagated to the output of B9 yet, because the circuit path between IN and the output terminal of B9 includes six circuits (B1, B2, B3, B7, and B9 and pass page 130). The voltage transition at IN propagates through B5 faster than through B9, because the circuit path between IN and the output terminal of B5 only includes four circuits (B1, B2, B4, B5). Therefore, the output voltage of B9 remains high, transistors Q3 and QT1 through QTn remain ON, and transistors Q0 and QF1 through QFn remain OFF for a period of time after the output of B5 goes high.

Because transistors Q2 and Q3 are ON, current flows from OUTB to ground. The extra current through transistors Q2 and Q3 helps to pull the voltage at OUTB down to $V_{OL}$. This extra current provides a faster falling edge rate at OUTB. Transistor Q1 is OFF, preventing current from pulling the voltage at OUTB up toward $V_{DD}$.

The extra current through n-channel transistors Q2 and Q3 provides a faster falling edge rate at OUTB. The falling edge rate at OUTB can be increased further by turning ON one or more of n-channel transistors MN1 through MNn. Transistors MN1 through MNn represents any number of n-channel transistors. Each of transistors MN1 through MNn is coupled to a corresponding one of transistors QT1 through QTn, as shown in FIG. 1.

Transistors MN1 through MNn are controlled by signals F1 through Fn, respectively. Any one of signals F1 through Fn can be pulled to a high voltage to turn ON a corresponding one of transistors MN1 through MNn.

N-channel transistors QT1 through QTn are ON, because the output of B9 is still high. When more of transistors MN1 through MNn are ON, more current flows from OUTB to ground, pulling OUTB down to $V_{OL}$ at a faster rate. Thus, the falling edge rate at OUTB can be adjusted to be compatible with any differential output standard by turning ON or OFF transistors MN1 through MNn using programmable signals F1 through Fn.

When the output voltage of B9 transitions low, transistor Q3 turns OFF, transistors QT1 through QTn turn OFF, and transistors Q0 and QF1 through QFn turn ON to get ready for the next up swing at OUTB. The extra currents that help to pull OUTB down to $V_{OL}$ through transistors Q3 and transistors MN1 through MNn are now cut off.

Thus, the extra current provided by transistor Q3 (and transistors MN1 through MNn) to increase the falling edge rate at OUTB only flows for a limited period of time. This limited period of time is defined by the time between when the output of B5 changes states and when the output of B9 changes state.

Preferably, the delay for a signal to pass to the output of B3 equals the delay for a signal to pass to the output of B5, and the delay for a signal to pass to the output of B9 equals the delay for a signal to pass to the output of B8. By making these delays equal, jitter in the output signal is reduced. One way to achieve this is by making the delay of B4 equal to the delay of pass gate 130, the delay of B3 equal to the delay of B5, and the delays of B7/B9 equal to the delay of B6/B8.

After the voltage at IN transitions from high to low, the output voltage of B3 transitions from low to high, causing transistor Q6 to turn ON and transistor Q5 to turn OFF. At this time, the recent voltage transition at IN has not propagated to the output of B8 yet, because there are two additional circuits in the path between IN and the output terminal of B8, as discussed above. Therefore, the output voltage of B8 remains high, transistors Q4 and QJ1 through QJn remain OFF, and transistors Q7 and QB1 through QBn remain ON.

Because transistors Q6 and Q7 are ON, current flows from OUT to ground. The extra current through transistors Q6 and Q7 helps to pull the voltage at OUT down to $V_{OL}$. Transistor Q5 is OFF, preventing current from pulling the voltage at OUT to $V_{DD}$.

The extra current through p-channel transistors Q6 and Q7 provides a faster falling edge rate at OUT. The falling edge rate at OUT can be increased further by turning ON one or more of n-channel transistors MXN1 through MXNn. Transistors MXN1 through MXNn represent any number of n-channel transistors. Each of transistors MXN1 through MXNn is coupled to a corresponding one of transistors QB1 through QBn, as shown in FIG. 1.

Transistors MXN1 through MXNn are controlled by signals F1 through Fn, respectively. Any one of signals F1 through Fn can be pulled to a high voltage to turn ON a corresponding one of transistors MXN1 through MXNn.

N-channel transistors QB1 through QBn are ON, because the output of B8 is still high. When more of transistors MXN1 through MXNn are ON, more current flows from OUT to ground, pulling OUT to $V_{OL}$ at a faster rate. Thus, the falling edge rate at OUT can be adjusted to be compatible with any differential output standard by turning ON or OFF transistors MXN1 through MXNn using programmable signals F1 through Fn.

When the output voltage of B8 transitions low, transistor Q7 turns OFF, transistors QB1 through QBn turn OFF, and transistors Q4 and QJ1 through QJn turn ON to get ready for the next up swing in the voltage at OUT. The extra currents that help to pull OUT down to $V_{OL}$ through transistors Q7 and MXN1 through MXNn are now cut off.

Thus, the extra current provided by transistor Q7 (and transistors MXN1 through MXNn) to increase the falling edge rate at OUT only flows for a limited period of time. This limited period of time is defined by the time between when the output of B3 changes states and when the output of B8 changes state.

After the voltage at IN transitions from high to low, the output voltage of B5 also transitions from high to low, causing transistor Q1 to turn ON and transistor Q2 to turn OFF. At this time, the recent voltage transition at IN has not yet propagated to the output of B9, because there are two additional circuits in the path between IN and the output terminal of B9, as discussed above. Therefore, the output voltage of B9 remains low, transistors Q3 and QT1 through QTn remains OFF, and transistor Q0 and QF1 through QFn remain ON for a short period of time after the output of B5 goes low.

Because transistors Q0 and Q1 are ON, current flows from $V_{DD}$ to OUTB. The extra current through transistors Q0 and Q1 helps to pull the voltage at OUTB up to $V_{OH}$. This extra current provides a faster rising edge rate at OUTB. Transistor Q2 is OFF, preventing current from pulling the voltage at OUTB down toward ground.

The extra current through n-channel transistors Q0 and Q1 provides a faster rising edge rate at OUTB. The rising edge rate at OUTB can be increased further by turning ON one or more of p-channel transistors MP1 through MPn. Transistors MP1 through MPn represent any number of n-channel transistors. Each of transistors MP1 through MPn is coupled to a corresponding one of transistors QF1 through QFn, as shown in FIG. 1.

Transistors MP1 through MPn are controlled by signals FP1 through FPn, respectively. Any one of signals FP1 through FPn can be pulled to a low voltage to turn ON a corresponding one of transistors MP1 through MPn.

P-channel transistors QF1 through QFn are ON, because the output of B9 is still low. When more of transistors MP1 through MPn are ON, more current flows from $V_{DD}$ to OUTB, pulling OUTB up to $V_{OH}$ at a faster rate. Thus, the rising edge rate at OUTB can be adjusted to be compatible with any differential output standard by turning ON or OFF transistors MP1 through MPn using programmable signals FP1 through FPn.

When the output voltage of B9 transitions high, transistor Q0 turns OFF, transistors QF1 through QFn turn OFF, and transistors Q3 and QT1 through QTn turn ON. The extra currents that help to pull OUTB up to $V_{OH}$ through transistors Q0 and transistors MP1 through MPn are now cut off.

Thus, the extra currents provided by transistor Q0 and transistors MP1 through MPn to increase the rising edge rate at OUTB only flow for a limited period of time. This limited period of time is defined by the time between when the output of B5 changes states and when the output of B9 changes state.

According to the present invention, the rising and falling edge rates of the voltage signal at the output terminals of an output buffer can be adjusted, as discussed above. For example, more of programmable edge rate transistors (QB1 . . . QBn, QJ1 . . . QJn, QF1 . . . QFn, QT1 . . . QTn) can be turned ON using control signals F1 . . . Fn and FP . . . FPn to increase the output edge rates at a constant output load. Different output standards may require different rising and falling edge rates. The present invention provides techniques for increasing or decreasing the output edge rates to match any differential output standard.

Different packages often have different load levels or different fan-outs. The charge currents at output terminals OUT and OUTB can be increased or decreased to drive packages with different load levels and different fan-outs. For example, more of the programmable edge rate transistors (QB1 . . . QBn, QJ1 . . . QJn, QF1 . . . QFn, QT1 . . . QTn) can be turned ON to drive a larger load or a larger fan-out at output terminals OUT and OUTB, while maintaining the output edge rates constant.

Equation (1) below illustrates the relationship between the capacitive load (or fan-out) C at the output terminals and the charging currents I provided by the edge rate transistors (Q7, QB1 . . . QBn, Q4, QJ1 . . . QJn, Q0, QF1 . . . QFn, Q3, QT1 . . . QTn).

$$dC = T * \frac{dI}{V} \quad (1)$$

In equation (1), V represents the voltage swing at OUT and OUTB from $V_{OH}$ to $V_{OL}$ or from $V_{OL}$ to $V_{OH}$, and T represents the time that the edge rate transistors are ON. If the capacitive loading C at the output terminals increases, the edge rate transistors need to provide a larger increase in the charging current dI to the output terminals to maintain a constant voltage swing V.

According to an embodiment of the present invention, buffers B8 and B9 can be designed with a programmable delay. The delay through buffers B8 and B9 can be increased to increase the charging time at OUT and OUTB. The delay through buffers B8 and B9 can also be increased to drive packages that have higher loads or more fan-out.

The charging time can also be decreased by decreasing the delay through buffers B8 and B9. For example, the delay through buffers B8 and B9 can be increased by enabling extra gates inside buffers B8–B9 or decreased by disabling the extra gates. The delay is preferably increased or decreased by the same amount in buffers B8 and B9.

The equation dC=I*dt/V describes the effect that programmable buffers B8–B9 have on the output edge rates. In this equation, C represents the capacitive output load (or fan-out), V represents the voltage swing at the output terminals, t represents the delay time that the edge rate transistors (Q7, QB1 . . . QBn, Q4, QJ1 . . . QJn, Q0, QF1 . . . QFn, Q3, QT1 . . . QTn) are ON, and I represents the charging currents provided by the edge rate transistors.

By increasing the time (dt) that the edge rate transistors are ON charging the output terminals, an output buffer can drive more capacitive output load C, while maintaining a constant voltage swing V.

The edge rate can also be increased to provide a faster data transfer rate or decreased to provide a slower data transfer rate. Equation (2) below shows the relationship between the maximum frequency $F_{MAX}$ of the data transfer rate that can be provided by an output buffer and the rising and falling edge rates ($T_{RISE}$ and $T_{FALL}$) at the output.

$$F_{MAX} \propto \frac{1}{T_{RISE} + T_{FALL}} \quad (2)$$

Equation (2) provides an estimate of the maximum data transfer rate. According to the present invention, the data transfer rate can be adjusted by adjusting the output edge rates. The data transfer frequency is inversely proportional to the edge rates. The faster the edge rate, the faster data rate can transfer.

Programmable buffer B8 is preferably not connected directly to buffer B5, and programmable buffer B9 is preferably not connected directly to buffer B3. As shown in FIG. 1, buffer B7 is coupled between B3 and B9, and buffer B6 is couple between B8 and B5. Programmable buffers B8 and B9 have additional circuitry that adds extra load. If B9 was directly connected to B3, B9 would add extra load to B3 that would undesirably slow down B3. If B8 was directly connected to B5, B8 would add extra load to B5 that would undesirably slow down B5. The extra load would reduce the relative time that the edge rate transistors are ON.

Note that in circuit 100, signals F1 through Fn control the falling edge rates of the OUT and OUTB terminals. The failing edge rates at OUT and OUTB are both increased or both decreased in response to changes in voltage signals F1 through Fn. In a further embodiment of the present invention, the falling edge rates at OUT and OUTB are adjusted independently of each other by using two different sets of signals to control transistors MXN1 . . . MXNn and transistors MN1 . . . MNn.

Also, in circuit 100, signals FP1 through FPn control the rising edge rates of the OUT and OUTB terminals. The rising edge rates at OUT and OUTB are both increased or both decreased in response to changes in voltage signals FP1 through FPn. The rising edge rates at OUT and OUTB are controlled independently of the falling edge rates at OUT and OUTB, because two different sets of signals are used for these sets of transistors. In a further embodiment of the present invention, the rising edge rates at OUT and OUTB are adjusted independently of each other by using two different sets of signals to control transistors MXP1 . . . MXPn and transistors MP1 . . . MPn.

According to another embodiment of the present invention, circuit 100 compensates for variations in process, voltage, and temperature that cause changes in the rising and falling edges rates of the output signals.

For example, when the temperature of circuit 100 increases or the supply voltage $V_{DD}$ decreases, all of the transistors in circuit 100 change state at a slower rate, because the current through the transistors is reduced. At a high temperature or low $V_{DD}$, the currents that control the rising and falling edge rates at OUT and OUTB are reduced. Therefore, the edge rates are slower.

At a high temperature or low $V_{DD}$, the time delay for signals to propagate through buffers B1–B9 and pass gate 130 increases. Because it takes a longer time for a signal to pass from the input to the output of each buffer, there is a longer time delay between a transition in the output signal of B3 and a transition in the output signal of B8.

As a result, current flows from OUT through Q6 to ground for a longer period of time to increase the discharge current during a falling edge at OUT. The increased discharge current through Q6 compensates at least partially for the decrease in the falling edge rate at OUT. Thus, the falling edge rate at OUT decreases less or not at all.

Current also flows from $V_{DD}$ through Q5 to OUT for a longer period of time during a rising edge of the voltage at OUT, because of the extra delay in the buffers. The increased charge current through Q5 compensates at least partially for the decrease in the rising edge rate at OUT. Thus, the rising edge rate at OUT decreases less or not at all.

There is also a longer time delay between a transition in the output signal of B5 and the output signal of B9 at a high temperature or low $V_{DD}$. As a result, current flows from OUTB through Q2 to ground for a longer period of time during a falling edge at OUTB. The increased discharge current through Q2 compensates at least partially for the decrease in the falling edge rate at OUT. Thus, the falling edge rate at OUT decreases less or not at all.

Current also flows from $V_{DD}$ through Q1 to OUTB for a longer period of time during a rising edge at OUTB, because of the extra delay in the buffers. The increased charge current through Q1 compensates at least partially for the decrease in the rising edge rate at OUTB. Thus, the rising edge rate at OUTB decreases less or not at all.

As another example, a fast silicon process, a high $V_{DD}$, or a low temperature cause the currents through the transistors in circuit 100 to increase. All of the transistors switch faster. As a result, the rising and falling edge rates at OUT and OUTB increase. At the same time, the time delay for signals to propagate through buffers B1–B9 and pass gate 130 decreases. Therefore, the edge rate transistors (Q7, QB1 . . . QBn, Q4, QJ1 . . . QJn, Q0, QF1 . . . QFn, Q3, QT1 . . . QTn) are turned OFF earlier to provide less charge or discharge current to the output terminals. The edge rate transistors compensate for the increased edge rates at OUT and OUTB. At a low temperature, high $V_{DD}$, or a fast process, the rising edge rates at OUT and OUTB increase less or not at all.

According to the present invention, changes in the delays in buffers B1–B9 and pass gate 130 help to compensate for changes in the rising and falling edge rates at OUT and OUTB that are caused by variations in process, supply voltage, and temperature. In some cases, changes in the edge rates of the output signals are partially compensated for. In other cases, the edge rates at OUT and OUTB remain constant or substantially constant over a range of temperature, supply voltage, and/or process variations. In these cases, the compensating effect discussed above fully cancels any changes in the edge rates caused by process, voltage, and temperature variations.

FIGS. 2 and 3 illustrates schematics of circuits 200 and 300, respectively. Circuits 200 and 300 are further embodiments of the present invention. Circuits 200 and 300 include all the circuit elements shown in circuit 100. In circuits 200 and 300, buffers B1–B9 are coupled together in different arrangements as shown in FIGS. 2 and 3.

In circuit 200, there are four circuits (B1, B2, B3, and pass gate 130) between IN and Q5/Q6, and five circuits (B1, B2, pass gate 130, B6, and B8) between IN and Q4/Q7. Also, there are four circuits (B1, B2, B4, B5) between IN and Q1/Q2, and five circuits (B1, B2, B4, B7, B9) between IN and Q0/Q3. Therefore, there is a delay during which time the edge rate transistors are ON, adding current to speed up the edge rate at OUT and OUTB. This delay is defined by the extra circuit between IN and Q0/Q3/Q4/Q7.

Circuit 300 includes additional inverters 301 and 302. Four circuits (B1, B2, pass gate 130, and B3) are coupled between IN and Q5/Q6, and seven circuits (B1–B3, pass gate 130, B7, B9, and inverter 301) are coupled between IN and Q4/Q7. This is a difference of three circuit delays.

Four circuits (B1,B2,B4,B5) are coupled between IN and Q1/Q2, and seven circuits (B1, B2, B4, B5, B6, B8, and inverter 302) are coupled between IN and Q0/Q3. This is also a difference of three circuit delays. Therefore, there is a three circuit delay during which time the edge rate transistors are ON. Circuit 300 can have faster edge rates at OUT and OUTB relative to circuit 200, because there is a three circuit delay in circuit 300, and only a one circuit delay in circuit 200, during which time the edge rate transistors are ON.

In circuits 100, 200, and 300, the edge rate transistors for OUT are ON for the same amount of time that the edge rate transistors for OUTB are ON, because there is an equal buffer delay. Therefore, the edge rates of OUT and OUTB can easily be set to be equal to each other. This reduces jitter in the output signals.

Figure 4A:
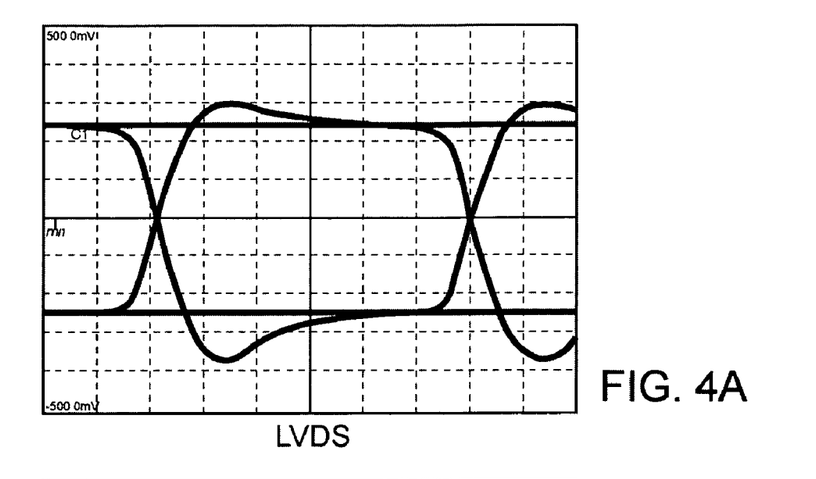
FIGS. 4A–4C illustrate eye diagrams that show output signals from output buffers of the present invention.
Figure 4B:
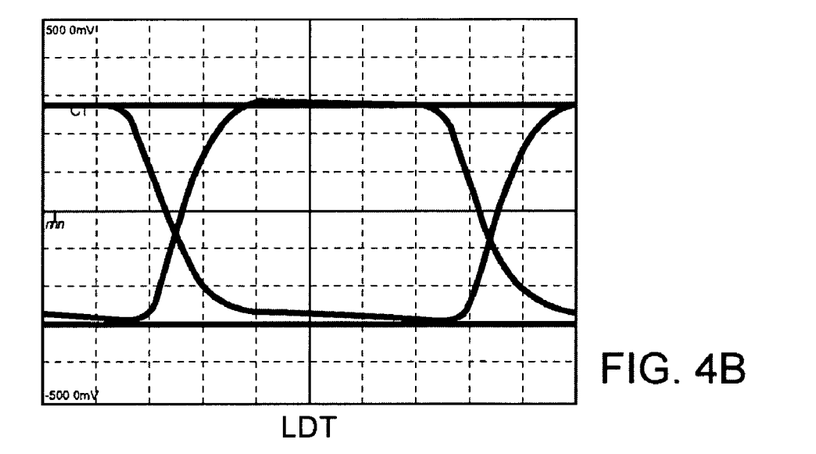
Figure 4C:
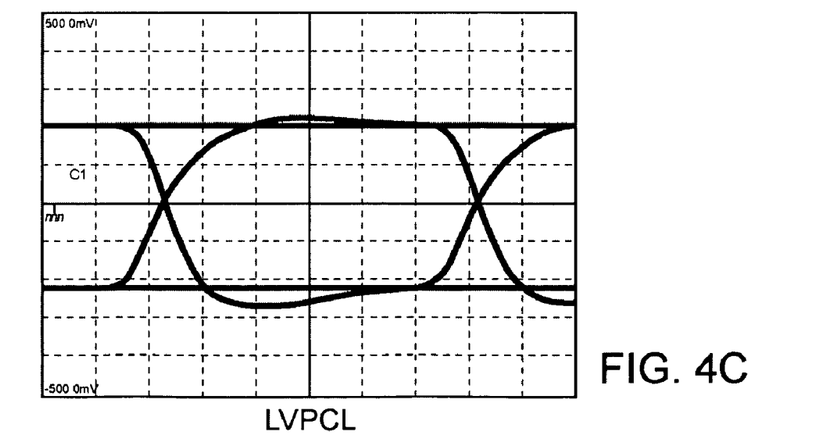

FIGS. 4A–4C illustrate eye diagrams that show output signals from output buffers of the present invention. FIGS. 4A–4C illustrate output signals that are adjusted to be compatible with LVDS, LDT, and LVPCL differential output standards, respectively, using the above described techniques. The output waveforms for output buffers of the present invention have fast and clean rising and falling edge rates, as shown in FIGS. 4A–4C, even for random input signal patterns. Output buffers of the present invention can deliver a higher data rate for higher performance.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An output buffer circuit, comprising:
  a first pull up transistor coupled to a first output terminal of the output buffer;
  a second transistor coupled between the first transistor and a first voltage source, an input of the second transistor being coupled to receive a first signal that controls a first voltage at the first output terminal;
  a third pull down transistor coupled to the first output terminal;
  a fourth transistor coupled between the third transistor and a second voltage source, an input of the fourth transistor being coupled to receive a second signal that controls a second voltage at the first output terminal;
  a fifth pull up transistor coupled between a second output terminal of the output buffer and the second transistor;
  a sixth pull down transistor coupled between the second output terminal and the fourth transistor, a seventh transistor coupled to the first transistor, an input of the seventh transistor being coupled to receive a third signal that controls the first voltage at the first output terminal;

an eighth transistor coupled to the third transistor, an input of the eighth transistor being coupled to receive a fourth signal that controls the second voltage at the first output terminal;

a ninth transistor coupled to the first transistor, an input of the ninth transistor being coupled to receive a fifth signal that controls the first voltage at the first output terminal; and a tenth transistor coupled to the third transistor, an input of the tenth transistor being coupled to receive a sixth signal that controls the second voltage at the first output terminal.

2. An output buffer circuit comprising:

a first pull up transistor coupled to provide current to a first output terminal of the output buffer;

a second pull down transistor coupled to draw current from the first output terminal;

a third transistor having an input coupled to a first control signal that can turn the third transistor ON and OFF to adjust a rising edge rate at the first output terminal;

a fourth transistor having an input coupled to a second control signal that can turn the fourth transistor ON and OFF to adjust a falling edge rate at the first output terminal;

a fifth transistor coupled to the first output terminal, the fifth transistor being coupled to receive an input signal of the output buffer at a point on a first circuit path; and a sixth transistor coupled to the fifth transistor and the third transistor, the sixth transistor being coupled to receive the input signal of the output buffer at a point on a second circuit path, wherein transitions in the input signal of the output buffer take longer to propagate to the sixth transistor along the second circuit path than to the fifth transistor along the first circuit path.

3. The output buffer of claim 2 further comprising:

a seventh transistor coupled to the first output terminal, the seventh transistor being coupled to receive the input signal of the output buffer at the point on the first circuit path; and an eighth transistor coupled to the seventh transistor and the fourth transistor, the eighth transistor being coupled to receive the input signal of the output buffer at the point on the second circuit path.

4. The output buffer of claim 3 wherein:

the first circuit path includes a first plurality of circuits; and the second circuit path includes a second plurality of circuits, wherein the second plurality of circuits is greater than the first plurality of circuits.

5. The output buffer of claim 4 wherein:

the first plurality of circuits includes a first buffer that has a programmable delay; and the second plurality of circuits includes a second buffer that has a programmable delay.

6. The output buffer of claim 2 further comprising:

a fifth transistor having an input coupled to a third control signal that can turn the fifth transistor ON and OFF to adjust a rising edge rate at the first output terminal.

7. The output buffer of claim 6 further comprising:

a sixth transistor having an input coupled to a fourth control signal that can turn the sixth transistor ON and OFF to adjust a falling edge rate at the first output terminal.

8. An output buffer circuit comprising:

a first pull up transistor coupled to provide current to a first output terminal of the output buffer;

a second pull down transistor coupled to draw current from the first output terminal;

a third transistor having an input coupled to a first control signal that can turn the third transistor ON and OFF to adjust a rising edge rate at the first output terminal;

a fourth transistor having an input coupled to a second control signal that can turn the fourth transistor ON and OFF to adjust a falling edge rate at the first output terminal;

a fifth pull up transistor coupled to provide current to a second output terminal of the output buffer;

a sixth pull down transistor coupled to draw current from the second output terminal;

a seventh transistor having an input coupled to the first control signal that can turn the seventh transistor ON and OFF to adjust a rising edge rate at the second output terminal; and an eighth transistor having an input coupled to the second control signal that can turn the eighth transistor ON and OFF to adjust a falling edge rate at the second output terminal.

9. A method for controlling an output voltage at a first output terminal of an output buffer, the method comprising:

providing current through a first transistor to pull up the output voltage at the first output terminal;

in response to a first control signal, providing current to the first output terminal through a second transistor to increase a rising edge rate of the output voltage;

drawing current through a third transistor to pull down the output voltage at the first output terminal;

in response to a second control signal, drawing current from the first output terminal through a fourth transistor to increase a falling edge rate of the output voltage;

in response to the first control signal, decreasing the rising edge rate of the output voltage at the first output terminal by turning OFF the second transistor; and in response to the second control signal, decreasing the falling edge rate of the output voltage at the first output terminal by turning OFF the fourth transistor.

10. The method of claim 9 further comprising:

in response to a third control signal, further increasing the rising edge rate of the output voltage by providing current to the first output terminal through a fifth transistor; and in response to a fourth control signal, further increasing the falling edge rate of the output voltage by drawing current from the first output terminal through a sixth transistor.

11. A method for controlling an output voltage at a first output terminal of an output buffer, the method comprising:

providing current through a first transistor to pull up the output voltage at the first output terminal;

in response to a first control signal, providing current to the first output terminal through a second transistor to increase a rising edge rate of the output voltage;

drawing current through a third transistor to pull down the output voltage at the first output terminal; and in response to a second control signal, drawing current from the first output terminal through a fourth transistor to increase a falling edge rate of the output voltage, wherein providing current to the first output terminal through the second transistor further comprises:

sensing transitions in an input signal of the output buffer at a fifth transistor through a first circuit path, the fifth transistor being coupled to the second transistor; and sensing transitions in the input signal of the output buffer at a sixth transistor through a second circuit path, the sixth transistor being coupled to the fifth transistor and the first output terminal, wherein transitions in the input signal take a longer period of time to travel through the first circuit path than the second circuit path.

12. The method of claim 11 wherein drawing current from the first output terminal through the fourth transistor further comprises:

sensing transitions in the input signal of the output buffer at a seventh transistor through the first circuit path, the seventh transistor being coupled to the fourth transistor; and sensing transitions in the input signal of the output buffer at an eighth transistor through the second circuit path, the eighth transistor being coupled to the seventh transistor and the first output terminal.

13. The method of claim 12 wherein:

the first circuit path includes a first buffer that has a programmable delay; and the second circuit path includes a second buffer that has a programmable delay.

14. A method for controlling an output voltage at a first output terminal of an output buffer, the method comprising:

providing current through a first transistor to pull up the output voltage at the first output terminal;

in response to a first control signal, providing current to the first output terminal through a second transistor to increase a rising edge rate of the output voltage;

drawing current through a third transistor to pull down the output voltage at the first output terminal;

in response to a second control signal, drawing current from the first output terminal through a fourth transistor to increase a falling edge rate of the output voltage;

providing current through a fifth transistor to pull up a voltage at a second output terminal of the output buffer;

in response to a third control signal, providing current to the second output terminal through a sixth transistor to increase a rising edge rate of the voltage at the second output terminal;

drawing current through a seventh transistor to pull down the voltage at the second output terminal; and in response to a fourth control signal, drawing current from the second output terminal through an eighth transistor to increase a falling edge rate of the voltage at the second output terminal.

15. The method of claim 14 further comprising:

in response to a fifth control signal, further increasing the rising edge rate of the voltage at the second output terminal by providing current to the second output terminal through a ninth transistor; and in response to a sixth control signal, further increasing the falling edge rate of the voltage at the second output terminal by drawing current from the second output terminal through a tenth transistor.

16. The method of claim 14 further comprising:

in response to the third control signal, decreasing the rising edge rate of the voltage at the second output terminal by turning OFF the sixth transistor; and in response to the fourth control signal, decreasing the falling edge rate of the voltage at the second output terminal by turning OFF the eighth transistor.

17. A method for adjusting an output voltage of an output buffer, the method comprising:

providing current through a first transistor to pull up a first output terminal to a first voltage in response to an input signal of the output buffer;

providing current through a second transistor to increase the first voltage in response to a first control signal;

drawing current through a third transistor to pull down the first output terminal to a second voltage in response to the input signal;

drawing current through a fourth transistor to decrease the second voltage in response to a second control signal;

providing current through a fifth transistor to pull up a second output terminal of the output buffer to a third voltage in response to the input signal of the output buffer;

providing current through a sixth transistor to increase the third voltage in response to a third control signal;

drawing current through a seventh transistor to pull down a second output terminal to a fourth voltage in response to the input signal; and drawing current through an eighth transistor to decrease the fourth voltage in response to a second control signal.

18. The method of claim 17 further comprising:

providing current through a fifth transistor to further increase the first voltage in response to a third control signal; and drawing current through a sixth transistor to further decrease the second voltage in response to a fourth control signal.

19. The method of claim 17 wherein the first and second voltages at the first output terminal can be driven to voltage levels that are compatible with any differential output standard.

20. An output buffer comprising:

a first driver comprising pull-up and pull-down transistors that are coupled a first output terminal;

first and second signal delay circuits that are coupled to receive input signals of the output buffer;

a third transistor coupled to the first output terminal and to an output of the first signal delay circuit; and a fourth transistor coupled to the third transistor and to an output of the second signal delay circuit, wherein the third and the fourth transistors are on at the same time beginning when a transition in the input signal of the output buffer from a first state to a second state propagates through the first signal delay circuit to the third transistor, and ending when the transition in the input signal propagates through the second signal delay circuit to the fourth transistor.

21. The output buffer defined in claim 20 further comprising:

a fifth transistor coupled to the first output terminal and to the output of the first signal delay circuit; and a sixth transistor coupled to the fifth transistor and the output of the second signal delay circuit, wherein the fifth and sixth transistors are on at the same time for a period of time that begins when a transition in the input signal of the output buffer from the second state to the first state propagates to the fifth transistor through the first signal delay circuit, the period of time ending when that transition in the input signal propagates to the sixth transistor through the second signal delay circuit.

22. The output buffer defined in claim 21 further comprising:
a seventh transistor coupled between the fourth transistor and a first supply voltage, wherein a gate of the seventh transistor is coupled to a first control signal that turns the seventh transistor on to adjust a first edge rate at the first output terminal; and
an eighth transistor coupled between the sixth transistor and a second supply voltage, wherein a gate of the eighth transistor is coupled to a second control signal that turns the eighth transistor on to adjust a second edge rate at the first output terminal.

23. The output buffer defined in claim 21 further comprising:
a second driver comprising pull-up and pull-down transistors that are coupled a second output terminal;
third and fourth signal delay circuits that are coupled to receive input signals of the output buffer;
a seventh transistor coupled to the second output terminal and to an output of the third signal delay circuit; and
an eighth transistor coupled to the seventh transistor and to an output of the fourth signal delay circuit,
wherein a transition in the input signal of the output buffer from the first state to the second state causes the seventh transistor to turn on at a first time and the eighth transistor to turn off at a second time after the first time.

24. The output buffer defined in claim 23 further comprising:
a ninth transistor coupled to the second output terminal and to the output of the third signal delay circuit; and
a tenth transistor coupled to the ninth transistor and the output of the fourth signal delay circuit,
wherein the ninth and tenth transistors are on at the same time for a period of time that begins when a transition in the input signal of the output buffer from the second state to the first state propagates to the ninth transistor through the third signal delay circuit,
the period of time ending when that transition in the input signal propagates to the tenth transistor through the fourth signal delay circuit.

25. The output buffer defined in claim 20 wherein:
the first signal delay circuit has a first plurality of buffers,
the second signal delay circuit has a second plurality of buffers that is greater than the first plurality of buffers,
one of the first plurality of buffers has a programmable delay, and
one of the second plurality of buffers has a programmable delay.

26. A method for controlling an output voltage at a first output terminal of an output buffer, the method comprising:
sensing transitions in an input signal of the output buffer at a first transistor through a first signal delay circuit, the first transistor being coupled to the first output terminal;

sensing transitions in the input signal of the output buffer at a second transistor through a second signal delay circuit, the second transistor being coupled to the first transistor;

providing current through a third transistor to pull up the output voltage at the first output terminal; and drawing current through a fourth transistor to pull down the output voltage at the first output terminal, wherein the first and the second transistors are on at the same time after a transition in the input signal of the output buffer from a first state to a second state propagates through the first signal delay circuit to the first transistor, until the transition in the input signal propagates through the second signal delay circuit to the second transistor.

27. The method defined in claim 26 further comprising:
sensing transitions in an input signal of the output buffer at a fifth transistor through the first signal delay circuit, the fifth transistor being coupled to the first output terminal; and sensing transitions in the input signal of the output buffer at a sixth transistor through the second signal delay circuit, the sixth transistor being coupled to the fifth transistor, wherein the fifth and sixth transistors are on at the same time for a period of time that begins when a transition in the input signal of the output buffer from the second state to the first state propagates to the fifth transistor through the first signal delay circuit, the period of time ending when that transition in the input signal propagates to the sixth transistor through the second signal delay circuit.

28. The method defined in claim 27 further comprising:
sensing transitions in an input signal of the output buffer at a seventh transistor through a third signal delay circuit, the seventh transistor being coupled to the second output terminal; sensing transitions in the input signal of the output buffer at an eighth transistor through a fourth signal delay circuit, the eighth transistor being coupled to the seventh transistor, providing current through a ninth transistor to pull up an output voltage at a second output terminal; and drawing current through a tenth transistor to pull down the output voltage at the second output terminal, wherein the seventh and the eighth transistors are on at the same time after a transition in the input signal of the output buffer from the first state to the second state propagates through the third signal delay circuit to the seventh transistor, until that transition in the input signal propagates through the fourth signal delay circuit to the eighth transistor.

* * * * *